(12) United States Patent
Hasegawa

(10) Patent No.: US 6,469,576 B2
(45) Date of Patent: Oct. 22, 2002

(54) AMPLIFIER CIRCUIT FOR A PHYSICAL RANDOM NUMBER GENERATOR AND A RANDOM NUMBER GENERATOR USING THE SAME

(75) Inventor: Jun Hasegawa, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/791,749

(22) Filed: Feb. 26, 2001

(65) Prior Publication Data

US 2001/0017569 A1 Aug. 30, 2001

(30) Foreign Application Priority Data

Feb. 29, 2000 (JP) ........................................ 2000-054611

(51) Int. Cl.[7] ................................................. H03F 3/45
(52) U.S. Cl. ......................... 330/69; 330/109; 330/252
(58) Field of Search ........................ 330/69, 107, 109, 330/110, 150, 124 R; 250/214 R

(56) References Cited

U.S. PATENT DOCUMENTS

| | | | |
|---|---|---|---|
| 5,570,221 A | * 10/1996 | Fujita | 250/214 A |
| 5,706,218 A | 1/1998 | Hoffman | 304/717 |
| 5,736,899 A | 4/1998 | Bowers et al. | 330/252 |
| 5,796,301 A | * 8/1998 | Tanabe et al. | 330/69 |
| 5,838,197 A | * 11/1998 | Tsukuda | 330/252 |
| 5,880,634 A | * 3/1999 | Babanezhad | 327/557 |
| 5,892,609 A | * 4/1999 | Saruwatari | 250/214 A |
| 5,955,918 A | * 9/1999 | Uno | 327/307 |

OTHER PUBLICATIONS

Hirose et al, "Instanteous–response, adjustment–free, 156Mbit/s limiting amplifier IC for burst–mode optical transmission", Electronics Letters, IEE Stevenage, GB, vol. 33, No. 2, Jan. 16, 1997, pp 151–152.

* cited by examiner

Primary Examiner—Robert Pascal
Assistant Examiner—Khanh Van Nguyen
(74) Attorney, Agent, or Firm—Arent Fox Kintner Plotkin & Kahn, PLLC

(57) ABSTRACT

An amplifier circuit for a physical random number generator for amplifying a very small signal to generate a physical random number signal includes a pair of first differential input terminals including a first non-inverted input terminal TVin1+ and a first inverted input terminal TVin1-, a pair of second differential input terminals including a second non-inverted input terminal TVin2+ and a second inverted input terminal TVin2-, a differential amplifying section for receiving signals respectively from said pairs of first and second differential input terminals and for producing differential output signals in a form of a linear combination of the input signals, and a first pair of differential output terminals including a first inverted output terminal TVO- and a first non-inverted output terminal TVO+ to output the differential output signals. This configuration increases performance of the amplifier circuit for a physical random number generator.

14 Claims, 9 Drawing Sheets

US 6,469,576 B2

AMPLIFIER CIRCUIT FOR A PHYSICAL RANDOM NUMBER GENERATOR AND A RANDOM NUMBER GENERATOR USING THE SAME

This application is based on Japanese Patent Application 2000-054611 filed on Feb. 29, 2000, all the content of which is incorporated herein by reference.

BACKGROUND OF THE INVENTION

1. Field of the Invention

The present invention relates to an amplifier circuit for very small signals to generate a physical random number and a random number generator using the same.

2. Description of the Related Art

There has been known a random number generating device in which a physical random number is generated using white noise of a Zener diode, an avalanche diode, or the like.

The white noise is a very small signal having an amplitude of about several tens of $\mu$Vrms. When the white noise is used, physically completely randomized signals can be generated. Namely, there are obtained random numbers with high purity or reliability. However, the white noise has small voltage amplitude. To obtain random numbers having amplitude to be used in practices, the white noise must be amplified by an amplifier circuit having an amplification factor of about several hundred.

FIG. 8 shows a prior art example of an amplifier circuit using metal oxide semiconductor (MOS) transistors.

An amplifier circuit A is a differential amplifier circuit. A source terminal S1 of an MOS transistor 101a and a source terminal S2 of an MOS transistor 101b are commonly connected to each other. The source terminals S1 and S2 are connected via a current source 2 to ground.

Drain terminals D1 and D2 respectively of the MOS transistors 101a and 101b are connected respectively via load resistors 103a an 103b to a power source voltage $V_{DD}$. An interconnecting point between the drain terminals D1 and the load resistor 103a is connected to an inverted output terminal TVout−. An interconnecting point between the drain terminals D2 and the load resistor 103b is connected to a non-inverted output terminal TVout+.

Gate terminals G1 and G2 respectively of the MOS transistors 101a and 101b are connected to a non-inverted input terminal TVin+ and an inverted input terminal TVin−, respectively.

The differential amplifier circuit A is a dual-end circuit. In an dual-end amplifier circuit, unlike in a single-end amplifier circuit, the circuit has a symmetric configuration. Therefore, when the power source voltage $V_{DD}$ varies, influence thereof appears in the inverted output terminal TVout− and the non-inverted output terminal TVout+. Since the influence of variation in the power source voltage $V_{DD}$ cancels each other in differential outputs, the circuit configuration is suitable for the amplification of a very small signal.

FIG. 9 shows an output-versus-input characteristic of the differential amplifier in a graph. The abscissa represents an input voltage Vin ($Vin^+ - Vin^-$) and the ordinate represents an output voltage Vout (Vout+, Vout−).

To amplify very small amplitude of a signal, for example, by amplifying white noise of an avalanche diode, even when the transistor 101a slightly differs in a characteristic, for example, in a threshold value (Vth) from the transistor 101b (FIG. 8), a problem occurs as follows.

In the amplification of very small amplitude, when the transistors 101a and 101b are equal in the characteristics to each other and an input offset is zero, the amplifier circuit operates in a range A shown in FIG. 8. The output-versus-input characteristic is hence a little distorted. However, when a small input offset of only about several millivolts (mV) exists between the transistors 101a and 101b, the operation range of the amplifier circuit is shifted to a range B shown in FIG. 8.

When the amplifier circuit operates in the range B in which the output-versus-input characteristic is nonlinear, the output waveform is distorted.

Since the input offset is amplified, like the input signal, by the amplification factor of several hundred to appear in the output signal. Therefore, an output offset becomes a very large value ranging from about several hundred millivolts to about one volt.

Although the circuit is symmetrically constructed, the operation is asymmetric. That is, symmetry between the inverted output and the noninverted output is lost. This is disadvantageous because the operation to cancel influence of the variation in the power source becomes weak and noise of the output signal cannot be reduced.

SUMMARY OF THE INVENTION

It is therefore an object of the present invention to provide an amplifier circuit for a physical random number generator and a physical random number generator using the same suitable for amplifying an output voltage from a device or an element of which a signal waveform has very small amplitude.

According to one aspect of the present invention, there is provided an amplifier circuit for a physical random number generator for amplifying a very small signal to generate a physical random number signal comprising a pair of first differential input terminals including a first non-inverted input terminal and a first inverted input terminal, a pair of second differential input terminals including a second non-inverted input terminal and a second inverted input terminal, a differential amplifying section for receiving signals respectively from said pairs of first and second differential input terminals and for producing differential output signals in a form of a linear combination of the signals and a first inverted output terminal and a first non-inverted output terminal to output the differential output signals.

According to one aspect of the present invention, there is provided a physical random number generator, comprising said amplifier circuit for a physical random number generator according to claim 1 and physical random number generating means connected to either one of said second non-inverted input terminal and said second inverted input terminal of amplifier circuit for a physical random number generator.

According to one aspect of the present invention, there is provided an amplifier circuit for a physical random number generator for amplifying a very small signal to generate a physical random number signal comprising a pair of first differential input terminals including a first non-inverted input terminal and a first inverted input terminal, a pair of second differential input terminals including a second non-inverted input terminal and a second inverted input terminal, a cascade connection of at least two differential amplifying sections, each of said two differential amplifying section receiving signals respectively from said first and second differential input terminals and producing differential output signals in a form of a linear combination of the signals, and a first inverted output terminal and a first non-inverted output terminal for outputting final differential output signals obtained through said cascade connection of at least two differential amplifying sections.

According to the present invention, there can be provided an amplifier circuit for a physical random number generator and a physical random number generator using the same in which in amplification of an output signal from a physical random number generator device, a signal component is amplified with a sufficiently high amplification factor and a low-frequency component including a direct-current (DC) component such as an offset is amplified with a lower amplification factor.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to FIGS. 1 to 5, description will be given of an embodiment of an amplifier circuit for a physical random number generator.

Figure 1:
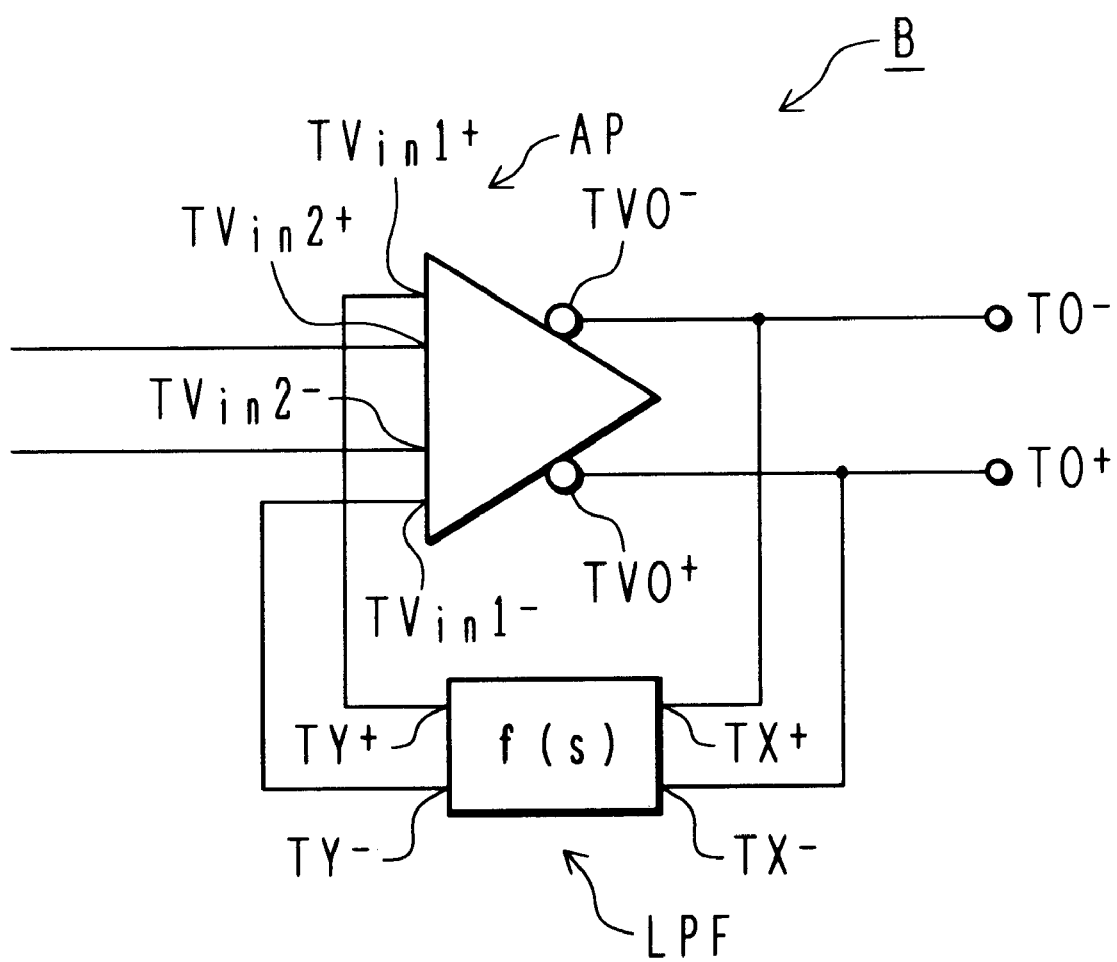
FIG. 1 is a block diagram schematically showing an embodiment of an amplifier circuit for a physical random number generator according to the present invention.

FIG. 1 shows an embodiment of an amplifier circuit for a physical random number generator B in a block diagram. The amplifier circuit B includes a differential amplifying section AP (differential amplifier) and a differential low-pass filter (LPF).

Figure 2:
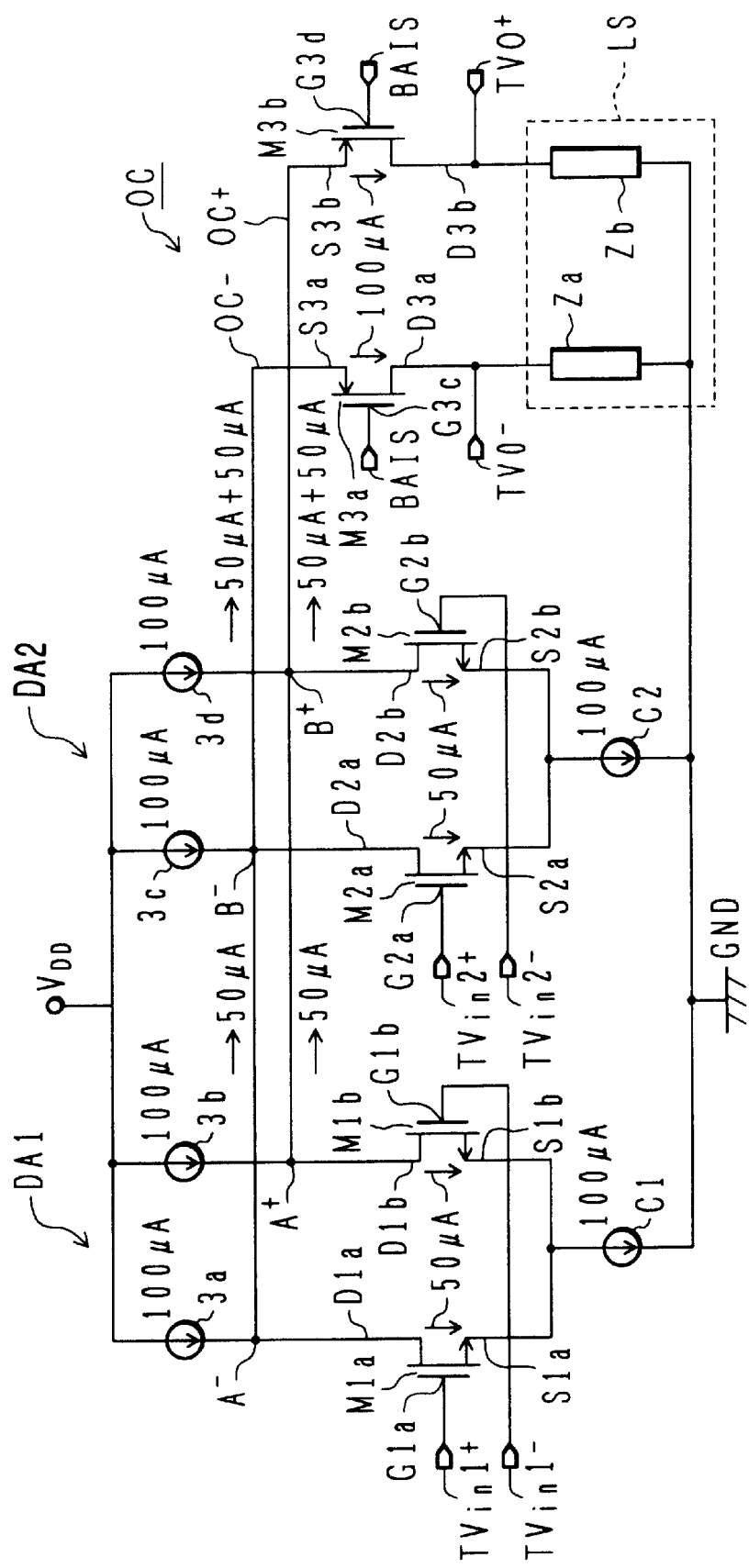
FIG. 2 is a circuit diagram showing a configuration of an amplifying section of the amplifier circuit shown in FIG. 1.
Figure 3:
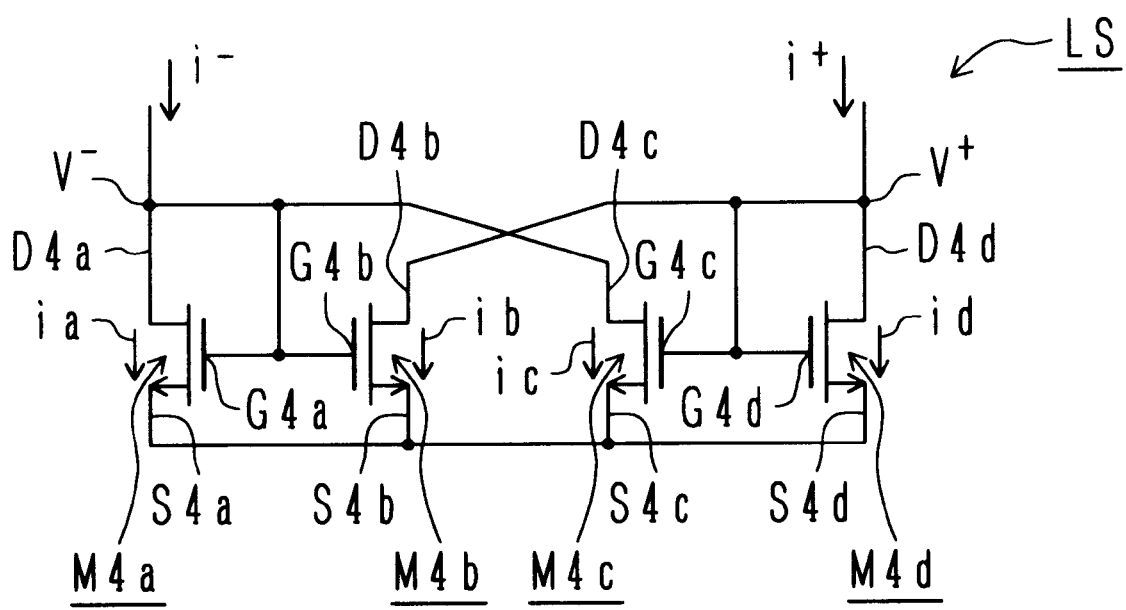
FIG. 3 is a circuit diagram showing a configuration of a load circuit of the amplifier circuit shown in FIG. 1.

FIGS. 2 and 3 show the amplifying section AP in a detailed circuit diagram.

FIG. 2 shows an overall configuration of the differential amplifying section AP in a circuit diagram. FIG. 3 shows a load circuit section LS (surrounded by a dotted line in FIG. 2) in a circuit diagram.

The amplifying section AP includes two differential amplifier circuits DA1 and DA2 and an output circuit OC.

In the first differential amplifier circuit DA1, source terminals S1a and S1b respectively of n-channel MOS transistors M1a and M1b are interconnected to each other at an interconnecting point. The interconnecting point is connected via a constant-current source C1 of, for example, 100 microampere ($\mu$A) to ground.

Gate terminals G1a and G1b respectively of the MOS transistors M1a and M1b are connected to a first non-inverted input terminal TVin1+ and a first inverted input terminal TVin1–, respectively.

Drain terminals D1a and D1b respectively of the MOS transistors M1a and M1b are connected to a power source voltage $V_{DD}$ respectively via constant-current sources $3a$ and $3b$ each of which supplies a current of, for example, 100 $\mu$A.

Assume that an interconnecting point between the drain terminal D1a and the constant current source $3a$ is A– and an interconnecting point between the drain terminal D1b and the constant current source $3b$ is A+.

In the second differential amplifier circuit DA2, source terminals S2a and S2b respectively of n-channel MOS transistors M2a and M2b are interconnected to each other at an interconnecting point. The interconnecting point is connected via a constant-current source C2 of, for example, 100 $\mu$A to ground.

Gate terminals G2a and G2b respectively of the MOS transistors M2a and M2b are connected to a second non-inverted input terminal TVin2+ and a second inverted input terminal TVin2–, respectively.

Drain terminals D2a and D2b respectively of the MOS transistors M2a and M2b are connected to a power source voltage $V_{DD}$ respectively via constant-current sources $3c$ and $3d$. Assume that an interconnecting point between the drain terminal D2a and the constant current source $3c$ is B– and an interconnecting point between the drain terminal D2b and the constant current source $3d$ is B+.

The interconnecting points A– and B– are connected to non-inverted output wiring OC$^+$. The interconnecting points A+ and B+ are connected to inverted output wiring OC$^-$.

The output circuit OC includes two p-type MOS transistors M3a and M3b and a load circuit LS. The load circuit LS includes a load Za and a load Zb.

An output signal via the inverted output wiring OC$^-$ from the amplifier circuit DA1 and an output signal via the non-inverted output wiring OC$^+$ from the amplifier circuit DA2 are respectively connected to source terminals S3a and S3b respectively of the MOS transistors M3a and M3b.

Drain terminals D3a and D3b respectively of the transistors M3a and M3b are respectively connected to the loads Za and Zb of the load circuit LS. An interconnecting point between the drain terminal D3a and the load Za is connected to a first inverted output terminal TV0–. An interconnecting point between the drain terminal D3b and the load Zb is connected to a first inverted output terminal TV0+.

Operation of the amplifier will be briefly described. Differential output currents obtained according to a differential input voltage of the amplifier circuit DA1 are delivered from the interconnecting points A+ and A–. Differential output currents obtained according to a differential input voltage of the amplifier circuit DA2 are delivered from the interconnecting points B+ and B–. These currents are respectively added to each other in nodes respectively of the non-inverted outputs OC+ and OC–. Each of resultant currents is converted by a load in the output circuit into a voltage to be outputted from an output terminal.

The circuit operation will be specifically descried.

When the same input voltage is applied to the gate terminal G1a and G1b, the same drain current flows in the MOS transistors M1a and M1b. According to the current conservation law, the drain current flowing through each of the transistors M1a and M1b is 50 μA. A current of 50 μA flows from each of the interconnecting points (nodes) A− and A+.

Also in the second amplifier circuit DA2, a current of 50 μA lows from each of the interconnecting points (nodes) B− and B+.

These currents are added to each other. Resultantly, a current of 100 μA flows from the first inverted output terminal TVO− via the transistor M3a to the load Za. A current of 100 μA flows from the first inverted output terminal TVO+ via the transistor M3b to the load Zb.

When a differential voltage <v1>=(Vin1+)−(Vin1−) is inputted to the first amplifier circuit DA1, a differential output current <i1>=gm1·<v1> flows from the first non-inverted output terminal TVout1− and the first inverted output terminal TVout1+. In the formula, gm1 indicates mutual conductance of the transistors M1a and M1b.

Similarly, when a differential voltage <v2>=(Vin2+)−(Vin2 −) is inputted to the second amplifier circuit DA2, a differential output current <i2>=gm2·<v2> flows from the nodes B− and B+. In the formula, gm2 indicates mutual conductance of the transistors M2a and M2b.

The differential input currents <i1> and <i2> are added to each other. A resultant current flows through via the cascade transistors M3a and M3b respectively to the loads Za and Zb. In the transistors M3a and M3b, the gates thereof are grounded, namely, bias terminals are grounded, The differential output is obtained as <VO>=−Rout·{<i1>+<i2>}=gm1·Rout·<v1>+gm2·Rout·<v2>.

Assume gm1·Rout=Ad and gm2·Rout=Bd. Then, <VO>= Ad·<v1>+Bd·<v2> holds.

The amplification factor is determined by conductance and load resistance. Assume gm1≈gm2=1 milliMho (mMho). To obtain a differential amplification factor of 40 decibel (dB), Rout must have a value of 100 kiloohm (kΩ). When a bias current of 100 μA is applied, an operation point of the output is at a very high value of 10 V. Therefore, if a simple resistor is used as a load, the power source voltage is considerably restricted.

To overcome this difficulty, the load circuit (LS) shown in FIG. 3 is used. As shown in FIG. 3, the load circuit LS includes four n-type MOS transistors M4a, M4b, M4c, and M4d. Source terminals S4a, S4b, S4c, and S4d respectively of the transistors M4a, M4b, M4c, and M4d are commonly connected to each other and are grounded together with one terminal of each of the current sources C1 and C2 (FIG. 2).

The circuit connections will be described in detail. Gate terminals G4a and G4b respectively of the transistors M4a and M4b are connected to each other at an interconnecting point. The interconnecting point is connected to drain terminals D4a and D4c respectively of transistors M4a and M4c. These terminals are connected to the drain terminal D3a of the transistor M3a.

Gate terminals G4c and G4d respectively of the transistors M4c and M4d are connected to each other at an interconnecting point. The interconnecting point is connected drain terminals D4b and D4d respectively of the transistors M4b and M4d.

These terminals are connected to the drain terminal D3d of the transistor M3b.

A current i⁻ of the inverted output wiring OC− is distributed into transistors M4a and M4c. A current i⁺ of the non-inverted output wiring OC+ is distributed into transistors M4b and M4d.

Next, operation of the load circuit section LS will be described. Assume that the transistors M4a to M4d are of the same characteristic and conductance and drain resistance are gm4 and rds4, respectively.

In general, gm is set to about several hundred microMho (μMho) and rds is set to several hundred kiloohm (kΩ). Description will be given of operation of the circuit according to a small signal analysis under this condition.

A current flows through each transistor as follows.

$$ia = gm4 \cdot (v-) + (v-/rds4)$$

$$ib = gm4 \cdot (v-) + (v+/rds4)$$

$$ic = gm4 \cdot (v+) + (v-/rds4)$$

$$id = gm4 \cdot (v+) + (v+/rds4)$$

Since i+=ib+id, $$i+ = gm4 \cdot (v-) + (v+/rds4) + gm4 \cdot (v+) + (v+/rds4)$$

results.
Since i−=ia+ic, $$i- = gm4 \cdot (v-) + (v-/rds4) + gm4 \cdot (v+) + (v-/rds4)$$

results.
Therefore, $$(i+)-(i-) = \{gm4 \cdot (v-)+(v+/rds4)+gm4 \cdot (v+)+(v+/rds4)\} - \{gm4 \cdot (v-)+ (v-/rds4)+gm4 \cdot (v+)+(v-/rds4)\} = 2\{(v+)-(v-)\}/rds4$$

is obtained.

The value of Rout, i.e., rds4/2 indicates a high equivalent resistance of several hundred kiloohm (kΩ). As above, using the active load, a high resistance value is obtained in the field of small signals.

Figure 4:
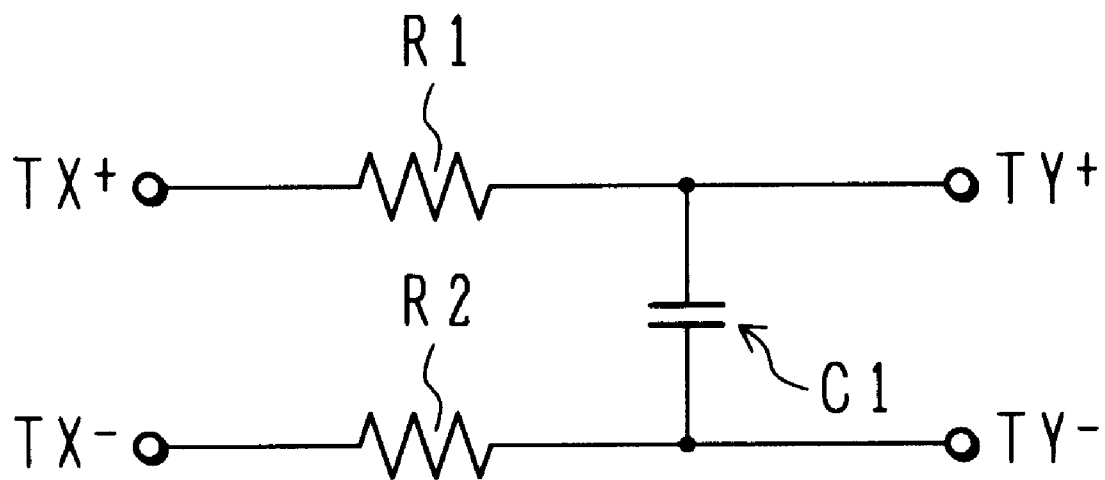
FIG. 4 is a circuit diagram showing a differential low-pass filter of the amplifier circuit shown in FIG. 1.

FIG. 4 shows a differential low-pass filter (LPF) in a circuit diagram.

The low-pass filter LPF includes a pair of differential input terminals TX+ and TX− and a pair of differential output terminals TY+ and TY−.

A first resistor R1 is connected between the input terminal TX+ and the output terminal TY+ and a second resistor R2 is connected between the input terminal TX− and the output terminal TY−. A first capacitor C1 is connected between the output terminals TY+ and TY−. The first capacitor C1 and the resistors R1 and R2 form a register-capacitor (RC) circuit.

Connections of the entire circuit will be described.

As can be seen from the block showing the overall circuit configuration, the first non-inverted output terminal TVO+ and the first inverted output terminal TVO− of the amplifier section AP are respectively connected to an inverted output terminal TO− and a non-inverted output terminal TO+ disposed as final points of the amplifier.

Signals outputted respectively from the first non-inverted output terminal TVO+ and the first inverted output terminal TVO− are fed via the low-pass filter LPF back respectively to the first non-inverted input terminal TVin1+ and the first inverted input terminal TVin1−. A negative feedback circuit is formed.

Operation of the amplifier circuit B will be theoretically described.

In the amplifier circuit B, <VO>=<VO+>−<VO−>, <V1>=Vin1+>−<Vin1−>, and <V2>=<Vin2+>−<Vin2−> hold.

In the amplifier circuit, a propagation function is expressed as follows.

$<VO>=-Ad(s)\cdot<V1>-Bd(s)\cdot<V2>$

When a feedback operation is conducted from the differential output terminal TVO(+, −) to the differential input terminals TVin1(+, −) with a feedback factor f(s), the propagation function of a resultant closed circuit is expressed as follows.

$<VO>=-Ad(s)\cdot f(s)\cdot<V0>-Bd(s)\cdot<V2>$

Therefore, $\{1+Ad(s)\cdot f(s)\}\cdot<VO>=-Bd(s)\cdot<V2>$ is obtained.

This can be reduced to $<VO>=-Bd(s)\cdot<V2>/\{1+Ad(s)\cdot f(s)\}$.

As a result, the propagation function Xd(s) of the differential output <VO> with respect to the differential input <V2> is expressed as follows.

$Xd(s)=<VO>/<V2>=-Bd(s)/\{1+Ad(s)\cdot f(s)\}$.

Assume that the feedback factor f(s) represents a linear LPF characteristic expressed as $f(s)=1/\{1+s\cdot\tau_f\}$. In addition, Ad(s)=Ad and Bd(s)=Bd hold. Assume that delay time of Ad(s) and Bd(s) is negligible for the delay of f(s) and Ad≈Bd>>1. Then, the propagation function is expressed as below.

$$Xd(s) = -Bd/\{1 + Ad\cdot f(s)\}$$
$$= -Bd/\{1 + Ad/(1+s\cdot\tau_f)\}$$
$$= -Bd/\{1+s\cdot\tau_f\}/(1+s\cdot\tau_f + Ad)$$
$$= -Bd/\{1+s\cdot\tau_f\}/(1+Ad+s\cdot\tau_f)$$
$$\approx -\{Bd/(1+Ad)\}\cdot\{(1+s\cdot\tau_f)/(1+s\cdot\tau_f/(1+Ad))\}$$
$$\approx -(Bd/Ad)\cdot\{(1+s\cdot\tau_f)/(1+s\cdot\tau_f/Ad)\}$$

Figure 5:
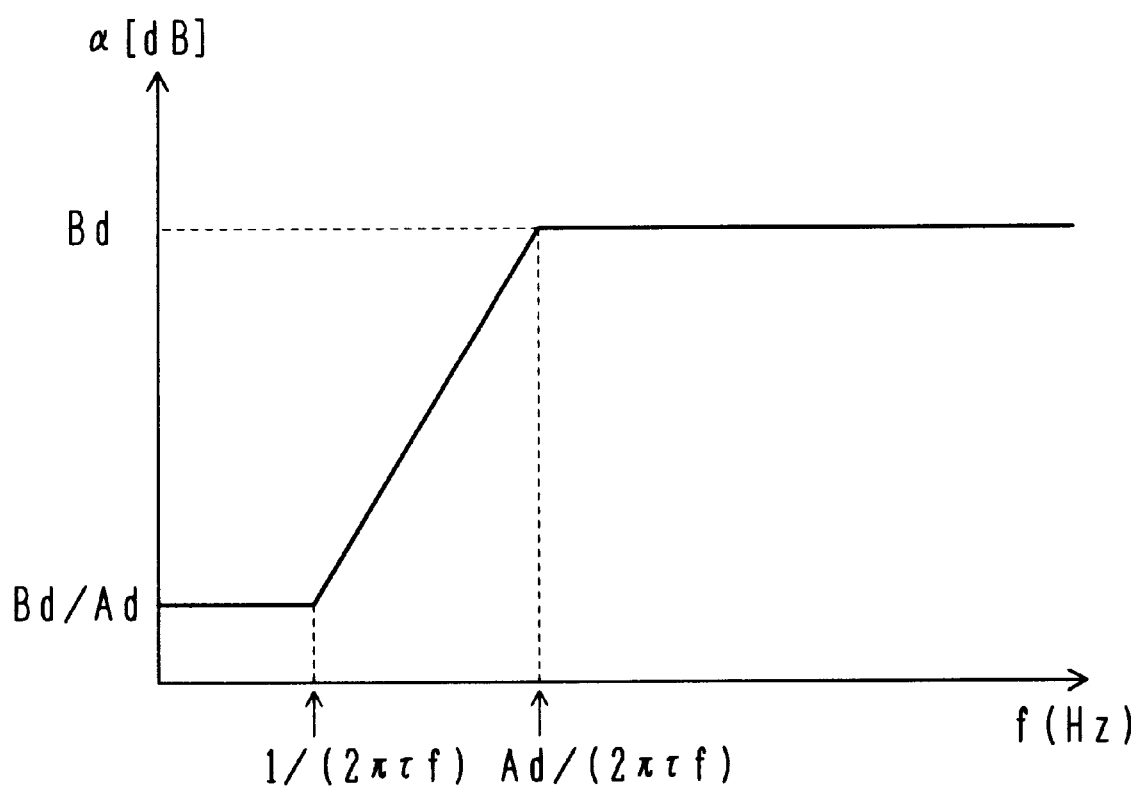
FIG. 5 is a graph showing a frequency characteristic of the amplification factor of the amplifier circuit shown in FIG. 1.

FIG. 5 shows an output-versus-input frequency characteristic in a graph.

For the amplification factor α of the amplifier circuit, Bd/Ad≈1 (according to Ad≈Bd) for s=0 (in a low-frequency range).

The amplification factor α monotonously increases from a frequency $fz=1/(2\pi\tau_f)$ to a frequency $fz=Ad/(2\pi\tau_f)$ and takes a value of Bd for $fz=Ad/(2\pi\tau_f)$. After $fz=Ad/(2\pi\tau_f)$, the amplification factor α takes substantially the fixed value Bd regardless of the frequency.

According to the frequency characteristic, the amplifier circuit B has a high-pass filter characteristic. That is, the amplification factor α takes a large value of Bd in the high-frequency range and is substantially equal to one in the low-frequency range.

In the amplifier circuit B of the embodiment, if a low-frequency component including a DC component caused by an input offset or the like is superimposed onto the input signals applied to the second non-inverted input terminal TVin2+ and the second inverted input terminal TVin2−, the amplification factor takes a value of about one for low-frequency input signals and Bd (about 100) for high-frequency input signals.

In short, the amplification factor is substantially one for an input offset of about several millivolts, and the output offset is kept at a low value of about several millivolts. For an input signal of about several tens of microvolts, the amplification factor takes a large value of about 100. The resultant output voltages <VO−> and <VO+> are obtained in a range from several millivolts to several tens of millivolts.

Figure 6:
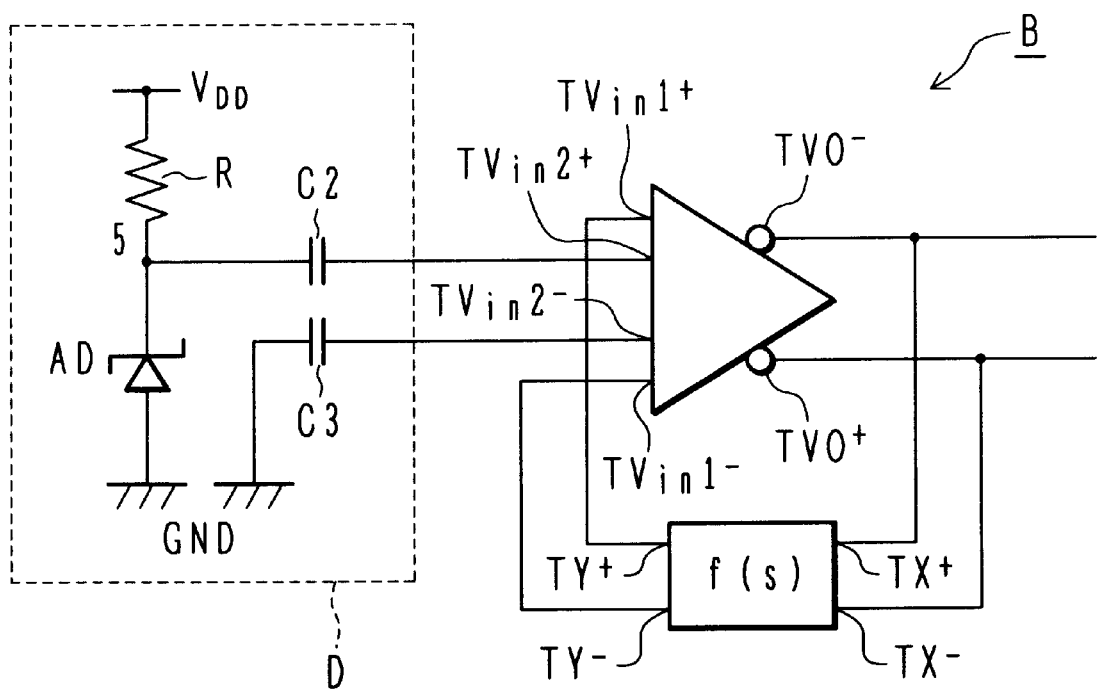
FIG. 6 is a block diagram showing a circuit configuration in which a physical random number generator device is connected to an amplifier circuit for a physical random number generator.

FIG. 6 shows in a block diagram a physical random number generator C in which an avalanche diode AD is used in the amplifier circuit.

The random number generator C includes an amplifier circuit B and a physical random number generating section D.

The random number generating section D includes a series connection of an avalanche diode AD and a load resister R. The series connection is connected between a power source $V_{DD}$ and ground GND. An interconnecting point between the avalanche diode AD and the load resister R is connected to the second non-inverted input terminal TVin2+ of the amplifier circuit B.

The random number generator D further includes a third capacitor C3 connected between the second inverted input terminal TVin2− of the amplifier circuit B and a ground terminal GND. The third capacitor C3 is arranged to keep balance with the second capacitor C2.

A voltage waveform having very small amplitude caused by white noise from the avalanche diode AD is inputted to the second non-inverted input terminal TVin2+ of the amplifier circuit B.

Voltage difference between the voltage inputted to the second non-inverted input terminal TVin2+ and the voltage inputted to the second inverted input terminal TVin2− of the amplifier circuit B is amplified by the amplifier circuit B to obtain an amplified output waveform as Vout{(VO+)−(VO−)}.

Since the DC component is removed by the low-pass filter LPF, the offset in the input voltage does not exert influence upon the output waveform. The physical random number can be generated with reduced distortion of the waveform.

As shown in FIG. 1, by connecting the amplifier circuit of FIG. 2 in this way, there can be configured an amplifier circuit in which the input offset does not exert any substantial influence upon the output waveform and a high amplification factor is obtained for the inherent signal component.

In the description of the embodiment, the amplifier circuit is constructed in a one-stage structure. However, to obtain a higher amplification factor, it is only necessary to connect the amplifier circuits in a several-stage cascade configuration.

Figure 7:
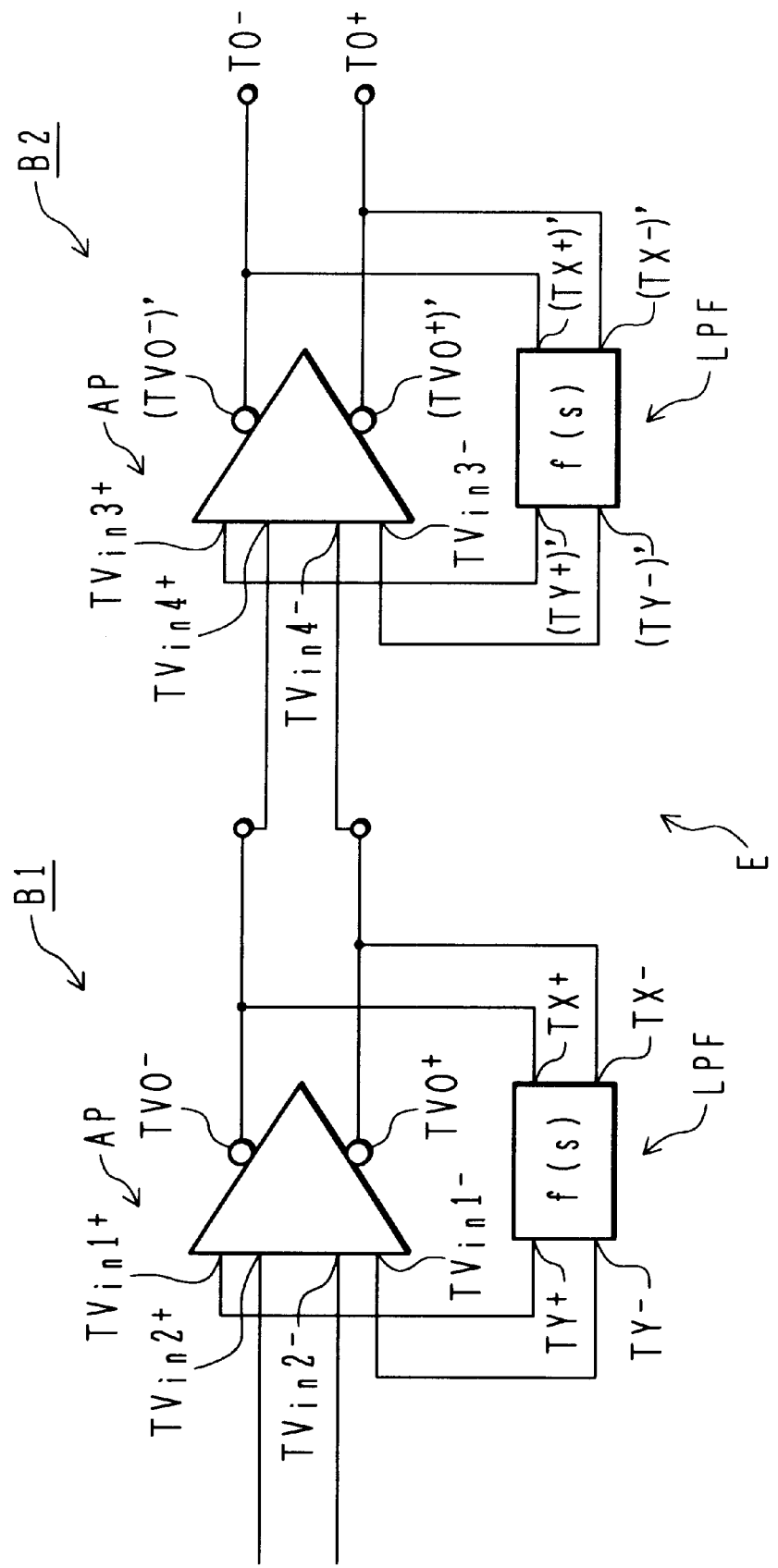
FIG. 7 is a block diagram schematically showing a embodiment of an amplifier circuit for a physical random number generator by cascading two amplifiers according to the present invention.
Figure 8:
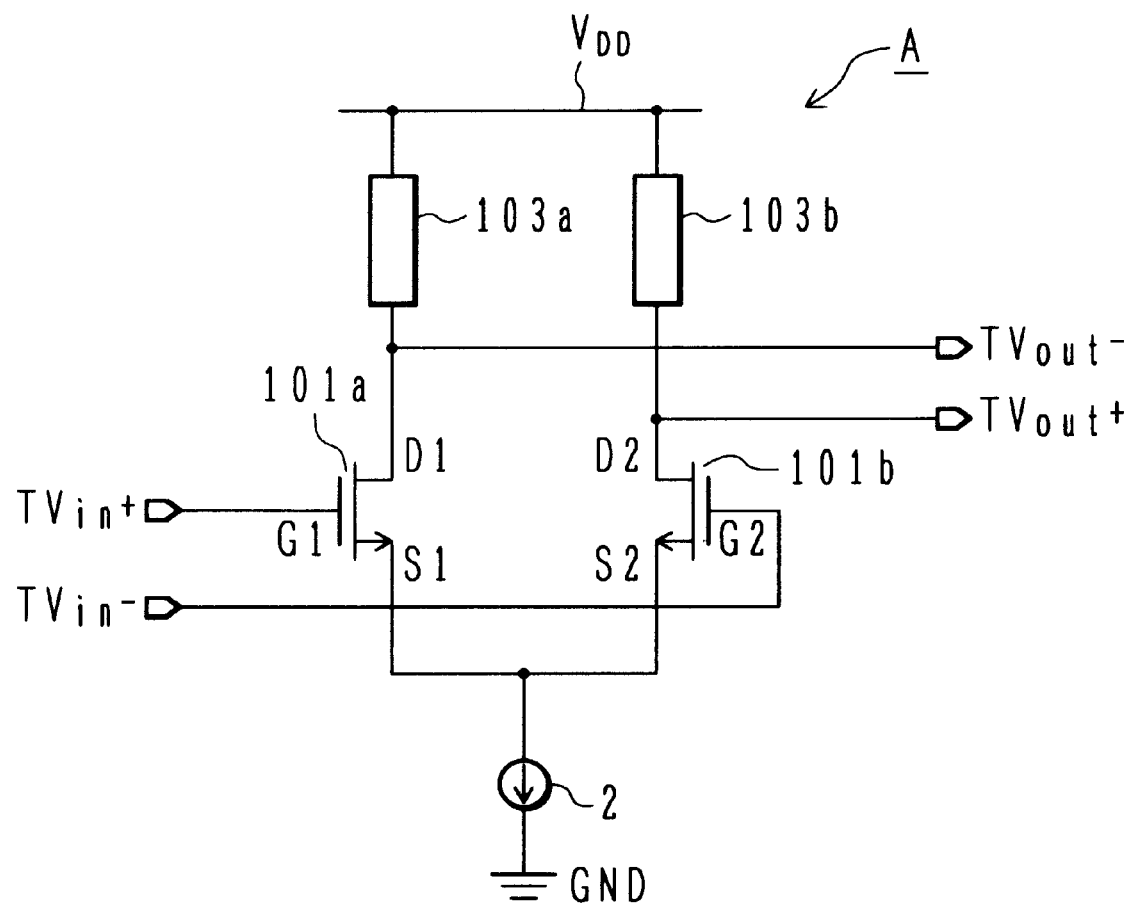
FIG. 8 is a circuit diagram showing a differential amplifier circuit of the prior art.
Figure 9:
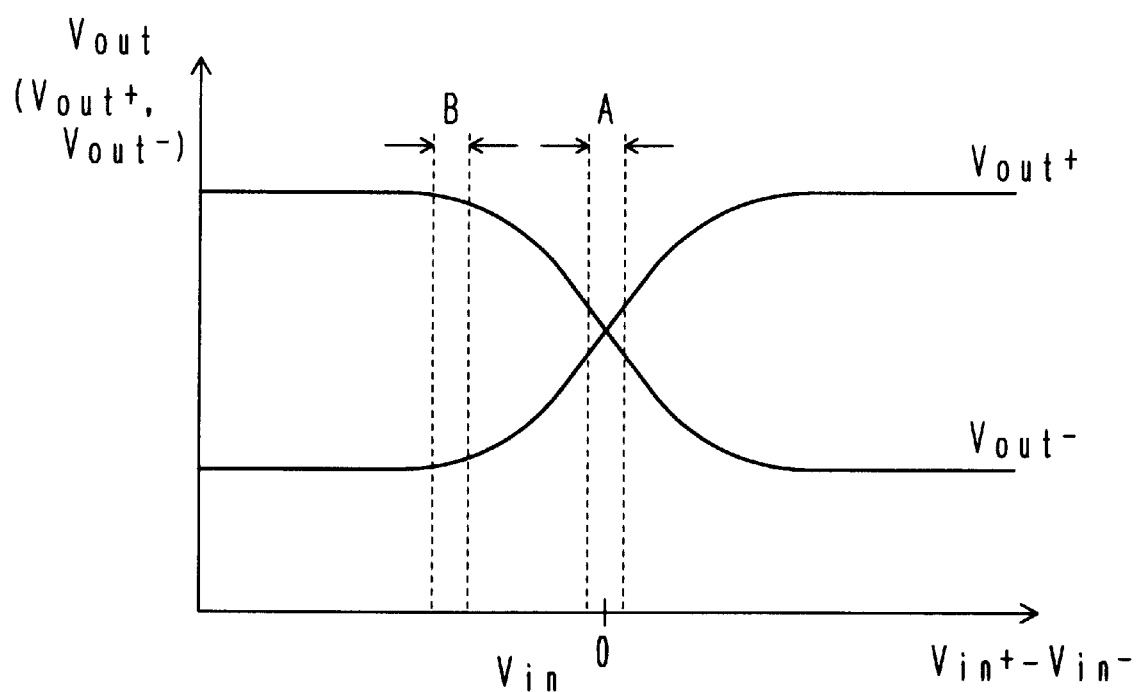
FIG. 9 is a graph showing a frequency characteristic of the amplification factor of the differential amplifier circuit shown in FIG. 7.

FIG. 7 shows a block diagram schematically showing a embodiment of an amplifier circuit for a physical random number generator by cascading two-stage amplifiers according to the present invention.

The two-stage amplifier E includes a first amplifier circuit B1 and a second amplifier circuit B2. The first and second amplifier is corresponding to the amplifier circuit shown in FIG. 1.

The inverted output terminal TVO− of the first amplifier B1 is connected to the fourth non-inverted input terminal TVin4+ of the second amplifier B2. The non-inverted output terminal TVO+ of the first amplifier B1 is connected to the fourth inverted input terminal TVin4− of the second amplifier B2.

The inverted output terminal TV0− of the second amplifier circuit B2 forms a final non-inverted output terminal TO− of the two-stage cascaded amplifier. The non-inverted output terminal TV0+ of the second amplifier circuit B2 forms a final inverted output terminal TO+ of the two-stage cascaded amplifier. More than 3 amplifiers can be cascaded similarly.

In this case, the resultant amplification factor is obtained by multiplying the amplification factors of the respective amplifier circuits by each other. Assume that the input offset of each amplifier circuit is ΔVoff. Even in an N-stage cascade connection, the offset voltage is obtained only as $(N)^{0.5}$ΔVoff. That is, the offset exerts only trifle influence.

Description has been illustratively given of an amplifier circuit for a physical random number generator and a physical random number generator using the same according to the embodiments. It is to be appreciated by those skilled in the art that various modifications, improvement, and combinations are possible for the embodiments.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An amplifier circuit for a physical random number generator for amplifying a very small signal to generate a physical random number signal, comprising:

a differential amplifier having a pair of first differential input terminals including a first non-inverted input terminal and a first inverted input terminal, and a pair of second differential input terminals including a second non-inverted input terminal and a second inverted input terminal for receiving input signals respectively from said pairs of first and second differential input terminals and for producing differential output signals in a form of a linear combination of said input signals, the differential amplifier having a first inverted output terminal and a first non-inverted output terminal to output the differential output signals; and a differential low-pass filter circuit including a pair of differential input terminals and a pair of differential output terminals for receiving differential signals to pass therethrough low-frequency components respectively thereof and for outputting differential output signals, said differential low-pass filter circuit disposed between said pair of first differential output terminals and said pair of first differential input terminals to form a feedback loop.

2. A physical random number generator, comprising:

said amplifier circuit for a physical random number generator according to claim 1; and physical random number generating means connected to both of said second non-inverted input terminal and said second inverted input terminal of said differential amplifier.

3. A physical random number generator according to claim 2, wherein said physical random number generating means is a device for generating white noise.

4. A physical random number generator according to claim 2, wherein said physical random number generating means is an avalanche diode or a Zener diode.

5. A physical random number generator, comprising:

said amplifier circuit for a physical random number generator according to claim 1; and physical random number generating means connected to either one of said second non-inverted input terminal and said second inverted input terminal of amplifier circuit for a physical random number generator.

6. A physical random number generator, comprising:

said amplifier circuit for a physical random number generator according to claim 1; and physical random number generating means connected to both of said second non-inverted input terminal and said second inverted input terminal of amplifier circuit for a physical random number generator.

7. A physical random number generator according to claim 6, wherein said physical random number generating means is a device for generating white noise.

8. A physical random number generator according to claim 6, wherein said physical random number generating means is an avalanche photo diode or a Zener diode.

9. An amplifier circuit for a physical random number generator for amplifying a very small signal to generate a physical random number signal, including a cascade connection of at least two differential amplifier stages, each of the stages comprising:

an amplifier circuit for a physical random number generator for amplifying a very small signal to generate a physical random number signal, comprising:

a differential amplifier having a pair of first differential input terminals including a first non-inverted input terminal and a first inverted input terminal, and a pair of second differential input terminals including a second non-inverted input terminal and a second inverted input terminal for receiving input signals respectively from said pairs of first and second differential input terminals and for producing differential output signals in a form of a linear combination of said input signals, the differential amplifier having a first inverted output terminal and a first non-inverted output terminal to output the differential output signals; and a differential low-pass filter circuit including a pair of differential input terminals and a pair of differential output terminals for receiving differential signals to pass therethrough low-frequency components respectively thereof and for outputting differential output signals, said differential low-pass filter circuit disposed between said pair of first differential output terminals and said pair of first differential input terminals to form a feedback loop.

10. A physical random number generator, comprising:

an amplifier circuit for a physical random number generator for amplifying a very small signal to generate a physical random number signal, including a cascade connection of at least two differential amplifier stages, each of the stages comprising:

an amplifier circuit for a physical random number generator for amplifying a very small signal to generate a physical random number signal, comprising:

a differential amplifier having a pair of first differential input terminals including a first non-inverted input terminal and a first inverted input terminal, and a pair of second differential input terminals including a second non-inverted input terminal and a second inverted input terminal for receiving input signals respectively from said pairs of first and second differential input terminals and for producing differential output signals in a form of a linear combination of said input signals, the differential amplifier having a first inverted output terminal and a first non-inverted output terminal to output the differential output signals; and a differential low-pass filter circuit including a pair of differential input terminals and a pair of differential output terminals for receiving differential signals to pass therethrough low-frequency components respectively thereof and for outputting differential output signals, said differential low-pass filter circuit disposed between said pair of first differential output terminals and said pair of first differential input terminals to form a feedback loop; and physical random number generating means connected to either one of said second non-inverted input terminal and said second inverted input terminal of amplifier circuit for a physical random number generator.

11. A physical random number generator according to claim 10, wherein said physical random number generating means is a device for generating white noise.

12. A physical random number generator according to claim 10, wherein said physical random number generating means is a device for generating white noise.

13. A physical random number generator, comprising:

an amplifier circuit for a physical random number generator for amplifying a very small signal to generate a physical random number signal, including a cascade connection of at least two differential amplifier stages, each of the stages comprising:

an amplifier circuit for a physical random number generator for amplifying a very small signal to generate a physical random number signal, comprising:

a differential amplifier having a pair of first differential input terminals including a first non-inverted input terminal and a first inverted input terminal, and a pair of second differential input terminals including a second non-inverted input terminal and a second inverted input terminal for receiving input signals respectively from said pairs of first and second differential input terminals and for producing differential output signals in a form of a linear combination of said input signals, the differential amplifier having a first inverted output terminal and a first non-inverted output terminal to output the differential output signals; and a differential low-pass filter circuit including a pair of differential input terminals and a pair of differential output terminals for receiving differential signals to pass therethrough low-frequency components respectively thereof and for outputting differential output signals, said differential low-pass filter circuit disposed between said pair of first differential output terminals and said pair of first differential input terminals to form a feedback loop; and physical random number generating means connected to both of said second non-inverted input terminal and said second inverted input terminal of amplifier circuit for a physical random number generator.

14. A physical random number generator according to claim 13, wherein said physical random number generating means is a device for generating white noise.

* * * * *